United States Patent
Hermes et al.

(10) Patent No.: US 11,851,324 B2
(45) Date of Patent: Dec. 26, 2023

(54) METHOD FOR SEALING ENTRIES IN A MEMS ELEMENT

(71) Applicant: Robert Bosch GmbH, Stuttgart (DE)

(72) Inventors: Christoph Hermes, Kirchentellinsfurt (DE); Hans Artmann, Boeblingen-Dagersheim (DE); Heribert Weber, Nuertingen (DE); Peter Schmollngruber, Aidlingen (DE); Thomas Friedrich, Moessingen-Oeschingen (DE); Tobias Joachim Menold, Weil der Stadt (DE); Mawuli Ametowobla, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 310 days.

(21) Appl. No.: 17/291,251

(22) PCT Filed: Dec. 13, 2019

(86) PCT No.: PCT/EP2019/085117
§ 371 (c)(1),
(2) Date: May 4, 2021

(87) PCT Pub. No.: WO2020/126922
PCT Pub. Date: Jun. 25, 2020

(65) Prior Publication Data
US 2022/0002147 A1  Jan. 6, 2022

(30) Foreign Application Priority Data
Dec. 21, 2018 (DE) .......................... 102018222749.7

(51) Int. Cl.
*B81C 1/00* (2006.01)

(52) U.S. Cl.
CPC .. *B81C 1/00047* (2013.01); *B81B 2201/0257* (2013.01); *B81B 2201/0264* (2013.01);
(Continued)

(58) Field of Classification Search
CPC ........ B81C 1/00047; B81C 2203/0145; B81C 1/00119; B81C 1/00182; B81C 2201/0116; B81B 2203/0315
See application file for complete search history.

(56) References Cited

U.S. PATENT DOCUMENTS

2008/0297992 A1  12/2008  Obata et al.
2009/0174148 A1*  7/2009  Bischof ............... B81C 1/00293
                                                                277/316
(Continued)

FOREIGN PATENT DOCUMENTS

DE       10024266 A1   11/2001
DE    102015224520 A1    6/2017
(Continued)

OTHER PUBLICATIONS

International Search Report for PCT/EP2019/085117, dated Mar. 17, 2020.

*Primary Examiner* — Moazzam Hossain
(74) *Attorney, Agent, or Firm* — NORTON ROSE FULBRIGHT US LLP; Gerard Messina

(57) ABSTRACT

A method for sealing entries in a MEMS element. The method includes: providing a functional layer having a functional region; producing a cavity underneath the functional region of the functional layer with the aid of a first entry outside of the functional region of the functional layer; sealing the first entry; producing a second entry to the cavity outside of the functional region of the functional layer;
(Continued)

melting sealing material in the region of the second entry; and cooling off the melted sealing material to seal the second entry.

17 Claims, 4 Drawing Sheets

(52) U.S. Cl.
CPC ............... *B81B 2203/0315* (2013.01); *B81C 2203/0145* (2013.01)

(56) References Cited

U.S. PATENT DOCUMENTS

| | | |
|---|---|---|
| 2010/0327380 A1 | 12/2010 | Chang |
| 2015/0175408 A1* | 6/2015 | Lee .................... B81C 1/00293 257/787 |
| 2015/0351246 A1 | 12/2015 | Baillin |
| 2016/0304338 A1 | 10/2016 | Saint-Patrice et al. |
| 2016/0368763 A1 | 12/2016 | Gonska et al. |
| 2018/0148320 A1* | 5/2018 | Yang .................... B81C 1/00293 |

FOREIGN PATENT DOCUMENTS

| | | |
|---|---|---|
| JP | 2000124470 A | 4/2000 |
| JP | 2004526578 A | 9/2004 |
| JP | 2005207959 A | 8/2005 |
| JP | 2006142242 A | 6/2006 |
| JP | 2007526108 A | 9/2007 |
| JP | 2008062319 A | 3/2008 |
| JP | 4111809 B2 | 7/2008 |
| JP | 4206849 B2 | 1/2009 |
| JP | 2013038727 A | 2/2013 |
| JP | 2015081774 A | 4/2015 |
| JP | 2015103821 A | 6/2015 |
| JP | 2015112703 A | 6/2015 |
| JP | 2015114318 A | 6/2015 |
| JP | 2016102693 A | 6/2016 |
| JP | 6050631 B2 | 12/2016 |

* cited by examiner

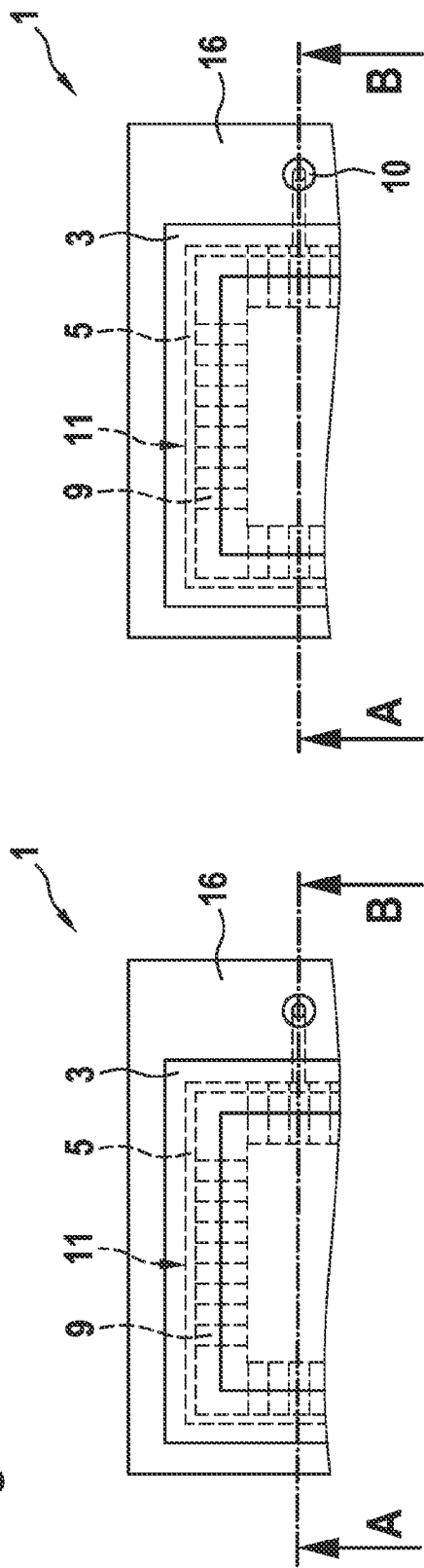
Fig. 2
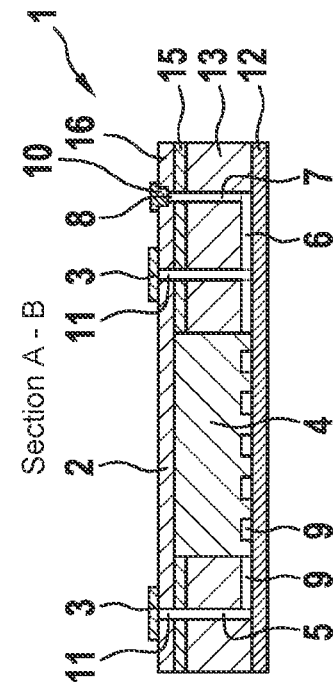
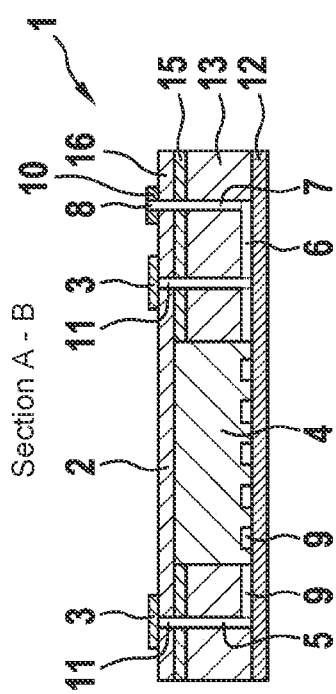

Fig. 3
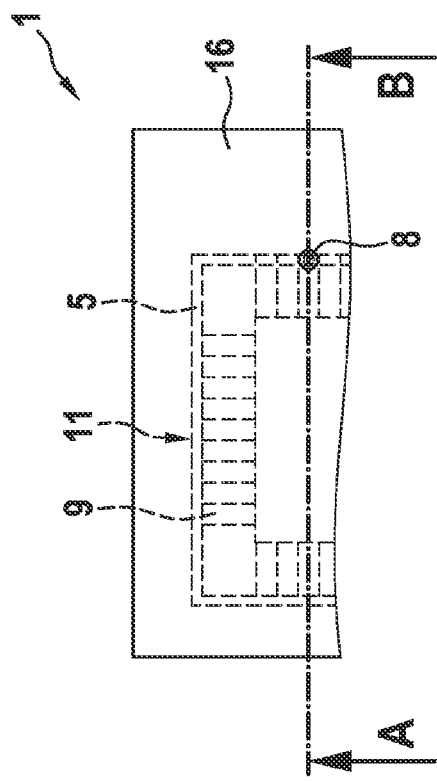
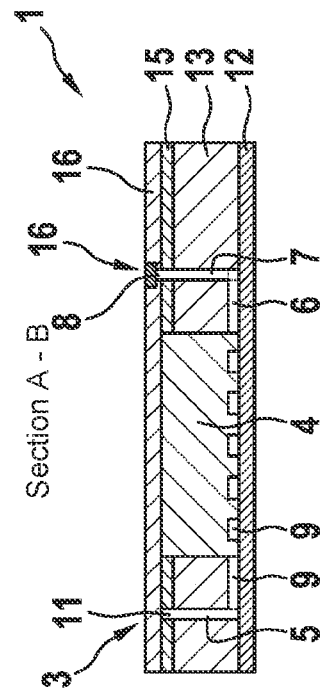
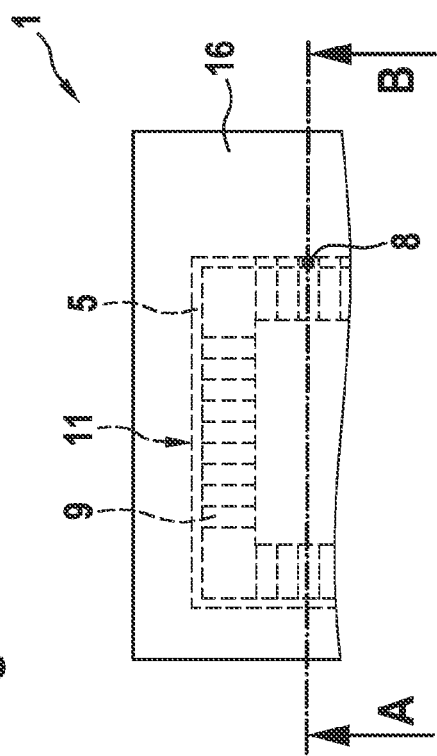
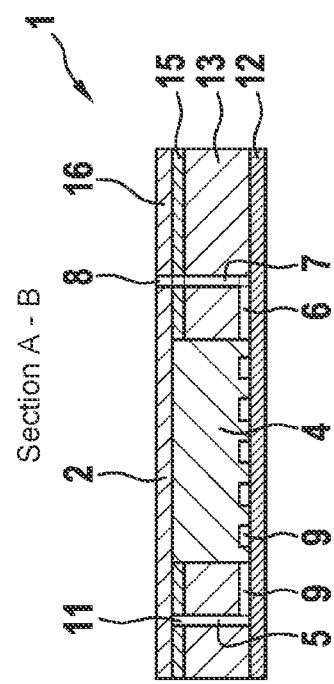

METHOD FOR SEALING ENTRIES IN A MEMS ELEMENT

FIELD

The present invention relates to a method for sealing entries in a MEMS element.

The present invention further relates to a MEMS element.

Although the present invention is generally applicable to any MEMS elements, the present invention is explained with regard to MEMS sensors in the form of MEMS microphones or MEMS pressure sensors having a flexible diaphragm and a specific inner cavity pressure.

BACKGROUND INFORMATION

In conventional MEMS sensors, such as MEMS pressure sensors or MEMS microphones, at least one cavity is formed, which is covered by at least one flexible diaphragm. A change in deflection of the flexible diaphragm, which is a function of pressure, in particular, ambient pressure, is detected, for example, due to a change in capacitance between two electrodes; the flexible diaphragm being able to constitute the first electrode, and a fixed and/or rigid counter-electrode being able to constitute the second electrode. During the manufacture of the MEMS pressure sensor, etching entries are needed, inter alia, for releasing the diaphragm, in order to be able to release the entire diaphragm. In this context, in order to be able to provide a specific internal pressure in the cavity produced under the diaphragm, these openings must be sealed again in a further method step.

German Patent Application No. DE 10 2015 224 520 A1 describes a method for manufacturing a micromechanical component having a substrate and a cap, which is connected to the substrate and encloses, together with the substrate, a first cavity; an access opening being filled substantially completely by a material region of the substrate or the cap that has transitioned, in a method step, into a liquid aggregate state; the access opening being filled between a first plane, which runs substantially parallelly to a major plane of the substrate and is situated on a side, facing away from the first cavity, of a region of the access opening formed substantially perpendicularly to the major plane, and a second plane, which runs substantially parallelly to the major plane of the substrate and is situated on a side, facing the first cavity, of the region of the access opening formed substantially perpendicularly to the major plane.

German Patent Application No. DE 10 2015 224 520 A1 describes a method for manufacturing a micromechanical component having a substrate and a cap, which is connected to the substrate and encloses, together with the substrate, a first cavity; a first pressure prevailing, and a first gaseous mixture having a first chemical composition being enclosed, in the first cavity;

in a first method step, an access opening is formed in the substrate or in the cap, the access opening connecting the first cavity to a surrounding area of the micromechanical component;

in a second method step, the first pressure and/or the first chemical composition in the first cavity being adjusted;

in a third method step, the access opening being sealed by introducing energy or heat into an absorbing part of the substrate or of the cap with the aid of a laser; a getter introduced into the first cavity prior to the third method step being activated at least partially during the third method step with the aid of laser radiation generated by the laser.

SUMMARY

In one specific embodiment, the present invention provides a method for sealing entries in a MEMS element, including the steps:

providing a functional layer having a functional region;
producing a cavity underneath the functional region of the functional layer with the aid of a first entry outside of the functional region of the functional layer;
sealing the first entry;
producing a second entry to the cavity, outside of the functional region of the functional layer;
melting sealing material in the region of the second entry; and
cooling off the melted sealing material to seal the second entry.

In a further specific embodiment, the present invention provides a MEMS element having a functional layer; a cavity being situated underneath a functional region of the functional layer; the cavity having at least two sealed entries, which are situated outside of the functional region of the functional layer; and at least one of the two entries being sealed, by melting sealing material in the region of the at least one entry and subsequently cooling off the melted sealing material.

One of the advantages achieved by this is that, consequently, the characteristics of the functional layer in the functional region are not changed by the sealing of, in particular, etching and/or ventilation or evacuation entries. A further advantage is that no entries have to be situated in the functional region, which means that the functional region is not influenced adversely. Since no additional and/or other materials must be situated in the functional region of the functional layer the following advantages, inter alia, are produced in the functional region for the functional layer and, consequently, for the operation of the MEMS element:

uniform thermal expansion
uniform mechanical characteristics
uniform layer thickness.

A further advantage is the high degree of flexibility, since the two entries may be positioned outside of the functional region in any configuration or form. In addition, it is not necessary for the functional region of the functional layer to be delimited completely or partially by one of the entries. In other words, the form and configuration of the functional region is independent of the positioning of the entries.

Further features, advantages and additional specific embodiments of the present invention are described in the following or become apparent from it.

According to one advantageous further refinement of the present invention, the sealing material situated in the region of the second entry is melted with the aid of a laser beam, and/or the sealing material to be melted is moved into the region of the second entry with the aid of a laser beam. An advantage of this is that the melting may be limited locally in a simple and, simultaneously, extremely reliable manner, and consequently, negative effects on the functional layer in the functional region may be prevented. If the sealing material to be melted is moved into the region of the second entry with the aid of a laser beam, then, therefore, the sealing material may also be situated initially outside of the immediate area of the second entry and then be moved with the aid of the laser beam to the second entry, in order to seal the same. Consequently, complex and exact positioning of sealing material directly in the region of the second entry is not necessary.

According to another advantageous further refinement of the present invention, additional material is deliberately deposited as sealing material in the region of the second entry. An advantage of this is that the flexibility in selecting the material for sealing the entry is increased, since, for example, sealing material already present in the entry region does not have to be used. A further advantage of this is that consequently, a sealing material may be chosen, which allows a particularly reliable bond of the sealing material and surrounding material in the region of the entry.

According to another advantageous further refinement of the present invention, the sealing material for melting is provided exclusively in the form of surrounding material of the surrounding area of the second entry. An advantage of this that in this manner, no additional and/or foreign material is needed in the region of the second entry.

According to another advantageous further refinement of the present invention, the sealing material to be melted is moved into the region of the second entry with the aid of a laser beam. Thus, the sealing material may also be situated initially outside of the immediate area of the second entry and then moved to the second entry with the aid of a laser beam, in order to seal the same. Consequently, complex and exact positioning of sealing material directly in the region of the second entry is not necessary.

According to another advantageous further refinement of the present invention, the sealing material is provided in the form of insulating material; in particular, the sealing material being provided in the form of silicon oxide, silicon nitride and/or silicon oxinitride. An advantage of insulating material is that no unwanted, conductive electrical connection is produced by it. A further advantage is a high degree of flexibility, if, for example, a combination of silicon oxide, silicon nitride and silicon oxinitride is used, since the amounts of the respective components may be adjusted appropriately to external conditions.

According to another advantageous further refinement of the present invention, a layer system for forming a eutectic upon melting is positioned as a sealing material in the region of the second entry. By warming, for example, using a laser, a eutectic, by which the entry may be sealed in a simple manner, is formed during the melting process. It may be, for example, an Au/Si or Al/Ge layer system. In order to form a local molten mass, a laser may be used for local heating. It is also possible for a method that heats an entire surface to be carried out, since a selectively chosen layer combination may allow the melting point of the sealing material to be reduced locally. The liquid phase formed in this case, that is, the eutectic, produces a reliable seal of the entry after solidifying.

According to another advantageous further refinement of the present invention, the functional region is provided in the form of a flexible diaphragm. This allows a MEMS pressure sensor operating in a particularly reliable manner, or the like, to be provided in a simple manner.

According to another advantageous further refinement of the present invention, starting from the cavity, the second entry is produced in a lateral direction, outside of the first entry, or, starting from the cavity, the second entry is produced in the lateral direction, between the cavity and the first entry. An advantage of positioning the second entry outside of the first entry is simple production of the second entry. An advantage in positioning the second entry between the cavity and the first entry is a compact configuration of the two entries.

According to another advantageous further refinement of the present invention, the first entry is produced in the form of a trench at least partially encircling the functional region. An advantage of this is that the cavity may be reliably exposed underneath the flexible diaphragm via a trench structure, and optionally, using additional lateral etching channels.

According to another advantageous further refinement of the present invention, the second entry is produced in the sealing region of the first entry. In this connection, the term "sealing region" is to be understood as the region of an entry, which is configured and/or intended to be sealed. One of the advantages achieved by this is that the second entry is produced in a region over and/or in the seal of the first entry, and in this manner, the second entry is connected directly to the cavity via the first entry, without an additional lateral channel. One of the advantages further achieved by this is that a separate, complete entry to the cavity, including a lateral channel structure, does not have to be produced, but unsealed sections may be used, or, after the sealing of the first entry, a deliberately introduced, second entry in the region of the first entry may be used, in order to enable access to the cavity.

According to another advantageous further refinement of the present invention, the second entry is formed to have an opening, whose lateral cross-sectional area is less than that of an opening of the first entry. An advantage of this is that, consequently, only a small access hole must be sealed, but not, for example, a trench encircling the flexible diaphragm completely. In this context, the shape of the lateral cross-sectional surface of the second entry may be selected arbitrarily; in particular, it is circular.

According to another advantageous further refinement of the present invention, the second entry is formed by an unsealed portion of an opening of the first entry, and/or by partially opening the sealed, first entry. An advantage of this is that the second entry may be formed in a flexible manner as a function of specified conditions.

According to another advantageous further refinement of the present invention, the second entry is connected to the cavity through a lateral channel, and in particular, via the first entry. After a first entry is sealed, this allows a defined inner cavity pressure to be set selectively in the cavity. In other words, the inner cavity pressure is not a function of the sealing method of the first entry, but may be set upon the sealing of the second entry. This increases the flexibility, that is, there is no limitation with regard to the method parameter, pressure, during the sealing operation of the first entry. This produces a markedly higher number of possible sealing methods for the first entry. The flexibility is further increased, if, for example, the lateral channel is not formed on the bottom layer of a MEMS layer construction, but, for example, at a distance from it. In this manner, the lateral channel may be produced, for example, and, in particular, as a function of the layer construction and the layer materials utilized, in a plane of the layer construction, in which it may be integrated in a simple manner in accordance with boundary conditions contingent on the construction and method.

According to another advantageous further refinement of the present invention, the first entry may be sealed in the same manner as the second entry. This allows the two entries to be sealed in a simple and reliable manner.

According to another advantageous further refinement of the present invention, the second entry is produced after the sealing of the first entry, in particular, with the aid of a plasma-etching method, in which the functional layer is etched through. Consequently, the second entry may be produced in a simple and rapid manner, without damaging the flexible diaphragm.

Additional features and advantages of the present invention follow from the figures, and from the corresponding description of the figures.

It is understood that the features mentioned above and still to be explained below may be used not only in the respectively indicated combination, but also in other combinations, or by themselves, without departing from the scope of the present invention.

Preferred variants and specific embodiments of the present invention are shown in the figures and are explained in more detail in the following description, where identical reference numerals denote the same or similar or functionally identical components or elements.

BRIEF DESCRIPTION OF THE DRAWINGS

FIG. 2 shows a top view and cross-sectional view of a MEMS element according to a specific embodiment of the present invention.

FIG. 3 shows a top view and cross-sectional view of a MEMS element according to a specific embodiment of the present invention.

DETAILED DESCRIPTION OF EXAMPLE EMBODIMENTS

Figure 1:
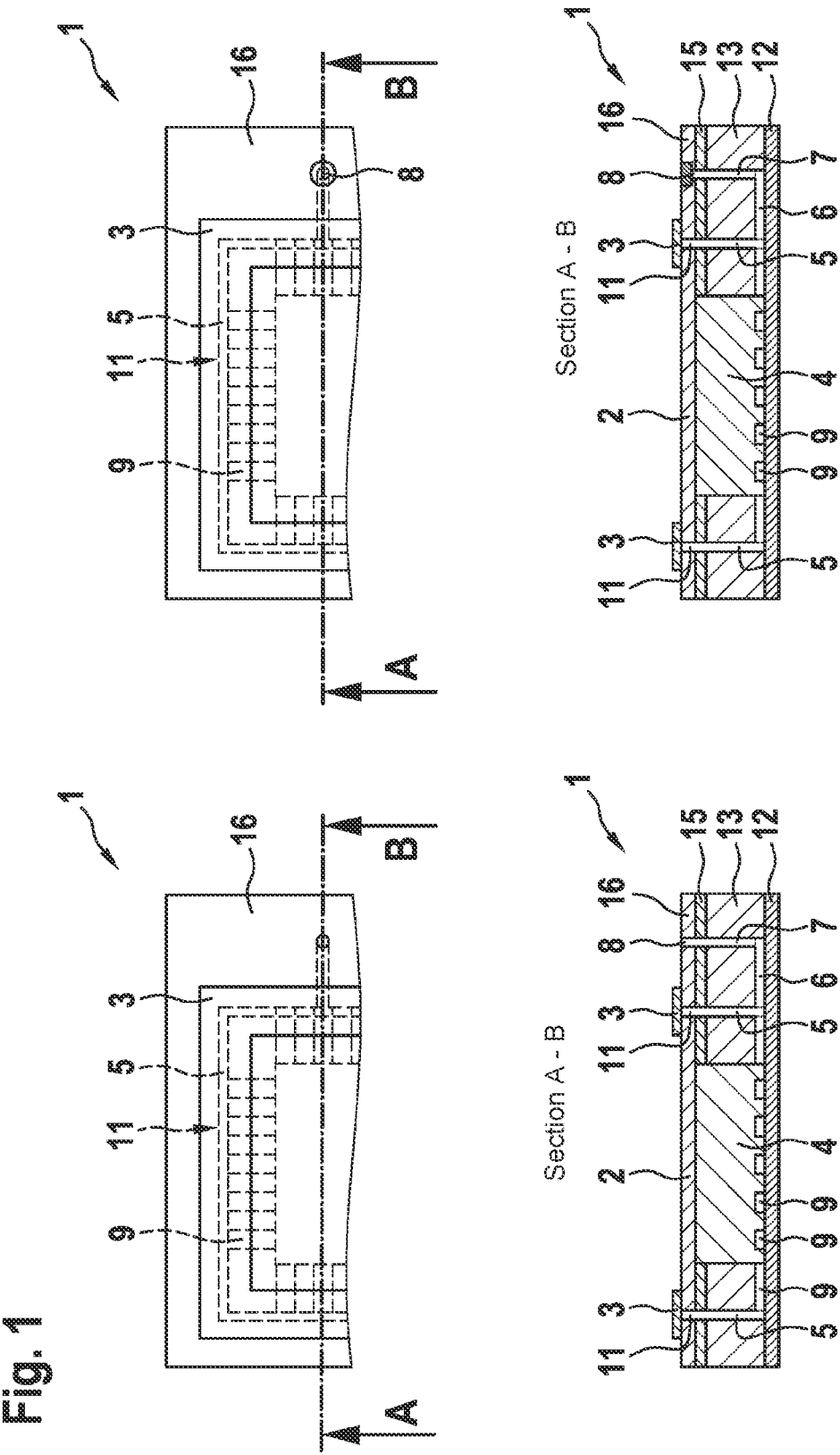
FIG. 1 shows a top view and cross-sectional view of a MEMS element according to a specific embodiment of the present invention.

In each of FIGS. 1 and 2, on the left side, a top view and a cross-sectional view of a MEMS element having two entries are shown, at the top and at the bottom, respectively, after the sealing of the first, and prior to the sealing of the second entry; and on the right side, a top view and a cross-sectional view of a MEMS element are shown, at the top and at the bottom, respectively, after the sealing of the first and second entries.

FIG. 1 shows a top view and cross-sectional view of a MEMS element according to a specific embodiment of the present invention.

In detail, a MEMS element 1, which includes a functional layer 16, is shown in schematic form in FIG. 1. Functional layer 16 has a functional region 2, which takes the form of a measuring diaphragm. Underneath functional layer 16, further layers 12, 13, 15 are situated one on top of the other, so that on the whole, MEMS element 1 has a layer construction. A cavity 4, which interrupts layers 13, 15 and is occluded at the bottom by layer 12, is situated underneath functional region 2. In this case, layer 12 may be understood as a layer on a substrate or as a substrate itself, and may be made up of a silicon wafer, for example. In this context, cavity 4 is connected via a, in particular, slot-shaped, peripheral trench 5, which is situated outside of the diaphragm surface, that is, outside of functional region 2, and has an opening 11, and via laterally positioned etching channels 9, which are used together as etching access for cavity 4. Thus, in this connection, the trench 5 with its opening 11 forms, together with etching channels 9, a first entry to cavity 4. For example, with the aid of a gas-phase etching method, sacrificial material may be removed from cavity 4 via opening 11 of trench 5, trench 5, and etching channels 9. Alternatively, sacrificial material may also be removed from cavity 4, using a wet-chemical etching method.

In addition, MEMS element 1 includes at least one further channel 6, which runs laterally and is situated underneath functional layer 16 and inside of the layer construction. In this context, lateral channel 6 is connected to cavity 4. In FIG. 1, the channel 6 running laterally is situated inside of layer 13. After the opening 11 of circumferential trench 5 has been sealed by sealing material 3, for example, with the aid of silicon oxide, a vertical entry 7 to lateral channel 6, including opening 8, is subsequently laid out in a region outside of functional region 2, so that cavity 4 may be ventilated or evacuated via lateral channel 6, vertical entry 7, and its opening 8. Therefore, lateral channel 6 and vertical entry 7 having opening 8 form a second entry to cavity 4. The vertical entry 7 having opening 8 may be laid out, for example, with the aid of a plasma etching method, in which functional layer 16 is suitably etched through, outside of functional region 2, in order to produce a connection to buried, lateral channel 6 in the vertical direction. In FIG. 1, starting from cavity 4, opening 8 is situated beyond opening 11 of trench 5 in the lateral direction. As an alternative, opening 8 may also be situated between cavity 4 and opening 11 of trench 5 in the lateral direction. Here, opening 8 takes the form of an access hole. For example, if functional region 2 takes the form of a flexible diaphragm, a stiffening element or the like (not shown in FIG. 1), which is used to locally reinforce the flexible diaphragm, may also be provided underneath functional region 2, on functional layer 16. In addition, further semiconductor circuit components and/or MEMS components (not shown in FIG. 1), which are used for the functionality and the operation of MEMS element 1, may be situated below functional region 2. Furthermore, opening 8 of second entry 6, 7, 8 to cavity 4 may be sealed, alternatively or additionally, using silicon nitride or a multilayer layer system made up of silicon oxide, silicon nitride and/or silicon oxinitride. In order to seal opening 11 of trench 5 and/or of the upper region and/or opening 8 of vertical entry 7, a silicon oxide seal, a silicon nitride seal, a silicon oxinitride seal, a seal made up of a combination of oxide, nitride, and oxinitride layers, or also a laser resealing method utilizing a laser source having, for example, a wavelength between 500 nm and 700 nm and/or between 900 nm and 1200 nm, may be used: Vertical entry 7 and/or trench 5 are sealed by locally melting and subsequently cooling sealing material in the region of opening 8 of vertical entry 7 and/or of opening 11 of trench 5. In this context, the entire functional region 2, thus, here in FIG. 1, the entire diaphragm surface, may be covered by an additional silicon nitride layer.

FIG. 2 shows a top view and cross-sectional view of a MEMS element according to a specific embodiment of the present invention.

A MEMS element 1 according to FIG. 1 is essentially shown in FIG. 2. In contrast to MEMS element 1 according to FIG. 1, in MEMS element 1 shown in FIG. 2, additional sealing material 10 is now situated on functional layer 16, in the region of opening 8 of vertical entry 7; the sealing material allowing a gas-tight seal of vertical entry 7, for example, through melting with the aid of a laser and subsequent cooling. It is also possible for sealing material 10 to be applied in the region of opening 11 of trench 5, and for this to be melted, for example, with the aid of a laser. Thus, after subsequent cooling, a gas-tight seal of trench 5 may also be provided.

Functional layer 16, which is situated on layer 15, may have a thickness between 10 nm and 500 µm and be made of polycrystalline or monocrystalline silicon. The thickness of functional layer 16 may preferably be between 100 nm and 2500 nm.

FIG. 3 shows a top view and cross-sectional view of a MEMS element according to a specific embodiment of the present invention.

A MEMS element 1 according to FIG. 1 is essentially shown in FIG. 3. In contrast to MEMS element 1 according to FIG. 1, in MEMS element 1 shown in FIG. 3, no vertical entry 7 is positioned with lateral channel 6, but vertical entry 7 is laid out in functional layer 16, which is situated above trench 5, in order to ventilate/evacuate cavity 4. The upper region, that is, access hole 8, of vertical entry 7 is then sealed again in an appropriate manner.

In this case, trench 5 is situated below functional layer 16, in the, or in one of the, layers 13, 15 situated under it. Thus, as described above, if, in functional layer 16, within the region of trench 5, at least one vertical entry 7 is laid out, for example, with the aid of a plasma etching method, which extends from the upper surface of functional layer 16 into trench 5, then this vertical entry 7 may be used, first of all, to remove material from cavity region 4 and, secondly, to ventilate or evacuate cavity 4 in a specific manner. As already described above, the at least one vertical entry 7 may be sealed, for example, using a silicon oxide seal, a silicon nitride seal, a silicon oxinitride seal, a seal made of a combination of oxide and nitride layers, or also using a laser resealing method, in which vertical entry 7 may be sealed by locally melting and subsequently cooling material in the upper region, that is, at, on, and/or in opening 8 of vertical entry 7. In this case, as well, it is possible, in turn, to deposit additional sealing material 10 on functional layer 16, in the upper region, that is, at, on, and/or in and around opening 8 of vertical entry 7, in order to seal vertical entry 7 with it.

Figure 4:
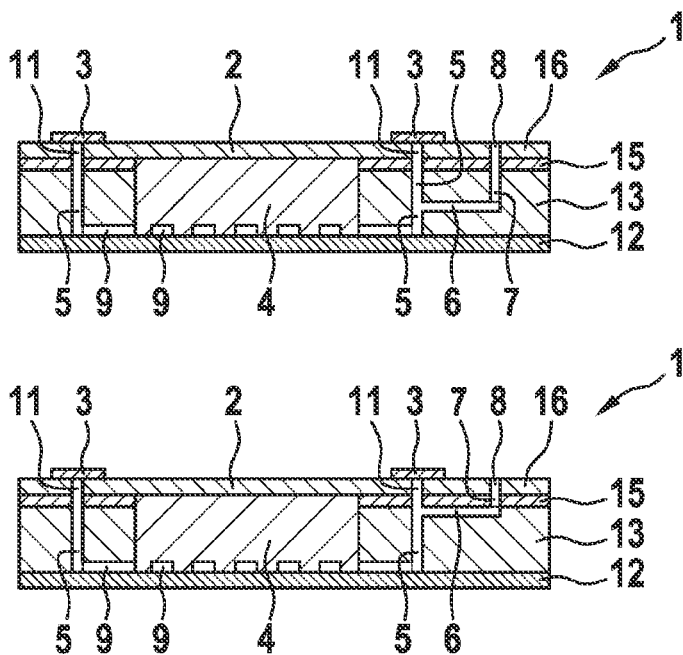
FIG. 4 shows MEMS elements according to top views and cross-sectional views of specific embodiments according to the present invention.

FIG. 4 shows cross-sections of MEMS elements according to specific embodiments of the present invention.

In each instance, a MEMS element 1 according to FIG. 1 is shown at the top of FIG. 4 and at the bottom of FIG. 4. In contrast to MEMS element 1 according to FIG. 1, in the MEMS elements 1 shown in FIG. 4, the specific lateral channel 6 for connecting vertical entry 7 and cavity 4 is situated at different elevations, starting out from bottom layer 12, in such a manner, that subregions of trench 5 and etching channels 9, which are connected to cavity 4, are used in order to be able to obtain etching access and/or ventilation/evacuation of cavity 4. In other words, cavity 4 is produced and/or ventilated/evacuated via etching channels 9, trench 5, the lateral channel 6 connected to it, and vertical entry 7 and its opening 8. The trench 5 itself is sealed in the region of functional layer 16.

Figure 5:
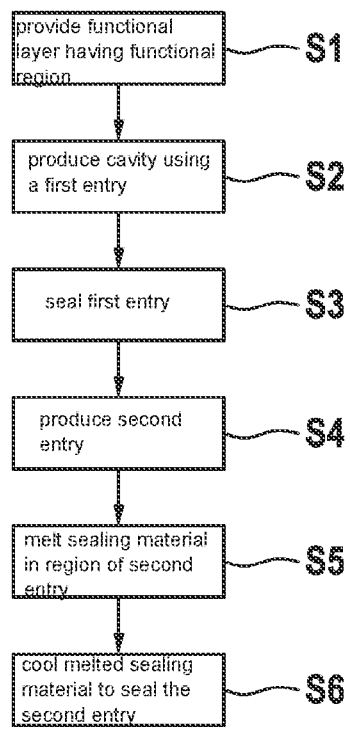
FIG. 5 show steps of a method according to a specific embodiment of the present invention.

FIG. 5 shows steps of a method according to a specific embodiment of the present invention.

Steps of a method for sealing entries in a MEMS element are shown in FIG. 5. In this context, the method includes the following steps.

In a first step S1, a functional layer having a functional region is provided.

Then, in a further step S2, a cavity is produced underneath the functional region of the functional layer with the aid of a first entry outside of the functional region of the functional layer.

Subsequently, in a further step S3, the first entry is sealed.

Then, in a further step S4, a second entry to the cavity is produced outside of the functional region of the functional layer.

Subsequently, in a further step S5, sealing material in the region of the second entry is melted.

Then, in a further step S6, the melted sealing material is cooled, in order to seal the second entry.

In summary, at least one of the specific embodiments of the present invention has at least one of the following advantages:

Simple and reliable sealing of thin layers, in particular, in the range of 10 nm to 500 µm, in particular, approximately 2 µm.

Simple implementation.

Cost-effective implementation.

Higher flexibility with regard to the positioning of the entries.

Characteristics of the functional region are not changed by the sealing.

No entries in the area of the functional region, therefore, no adverse influence on the same.

No additional and/or other materials in the functional region of the functional layer, therefore, uniform thermal expansion and uniform mechanical characteristics.

Prevention of fluctuations in thickness in the functional region caused by the sealing method.

Adjustment of the internal pressure is independent of the first sealing method.

Although the present invention was described in light of preferred exemplary embodiments, it is not limited to them, but is modifiable in numerous ways. Thus, for example, a plurality of second entries may be produced. These may be sealed with the aid of the same or different methods.

What is claimed is:

1. A method for sealing entries in a MEMS element, comprising the following steps:
   providing a functional layer having a functional region;
   producing a cavity underneath the functional region of the functional layer using a first entry outside of the functional region of the functional layer, at least a part of the first entry is a trench that extends circumferentially around at least a part of the cavity so that the first entry is arranged at multiple sides of the cavity;
   sealing the first entry after the production of the cavity;
   subsequent to the sealing of the first entry, producing a second entry to the cavity, outside of the functional region of the functional layer, wherein the second entry is located laterally to a single position of the cavity without extending circumferentially around the cavity, so that the second entry is entirely located laterally to only a single side of the cavity;
   melting sealing material in a region of the second entry; and
   cooling off the melted sealing material to seal the second entry.

2. The method as recited in claim 1, wherein the sealing material situated in the region of the second entry is melted using a laser beam, and/or the sealing material to be melted is moved into the region of the second entry using a laser beam.

3. The method as recited in claim 1, wherein additional sealing material is deliberately deposited as the sealing material in the region of the second entry.

4. The method as recited in claim 1, wherein the sealing material for melting is provided exclusively in the form of surrounding material of a surrounding area of the second entry.

5. The method as recited in claim 1, wherein the sealing material is provided in the form of insulating material.

6. The method as recited in claim 1, wherein the sealing material is provided in the form of silicon oxide, and/or silicon nitride and/or silicon oxinitride.

7. The method as recited in claim 1, wherein a layer system for forming a eutectic upon melting is positioned as the sealing material in the region of the second entry.

8. The method as recited in claim 1, wherein, starting from the cavity, the second entry is produced radially exterior to the first entry.

9. The method as recited in claim 1, wherein the at least the part of the first entry includes a trench running around at least part of the functional region.

10. The method as recited in claim 1, wherein in a sealing region of the first entry, the second entry is produced in such a manner, that the second entry is connected to the cavity via the first entry.

11. The method as recited in claim 1, wherein the second entry is formed to have an opening whose lateral cross-sectional area is less than that of an opening of the first entry.

12. The method as recited in claim 1, wherein the second entry is formed by partially opening the sealed, first entry.

13. The method as recited in claim 1, wherein the second entry is connected to the cavity by a lateral channel and only via a part of the first entry.

14. The method as recited in claim 1, wherein the second entry is sealed in the same manner as the first entry.

15. The method as recited in claim 1, wherein the second entry is produced after the sealing of the first entry using a plasma etching method, in which the functional layer is etched through.

16. The method as recited in claim 1, wherein, starting from the cavity, the second entry is produced radially between the cavity and the first entry.

17. A MEMS element, comprising:
a functional layer; and
a cavity situated under a functional region of the functional layer, wherein:
a sealed first entry into the cavity (i) at least partly extends as a trench circumferentially around at least a part of the cavity so that the sealed first entry is arranged at multiple sides of the cavity, (ii) is situated outside of the functional region of the functional layer, and (iii) is sealed by melted sealing material in a region of the at least one entry and subsequently cooling off the melted material; and
an unsealed second entry into the cavity, outside of the functional region of the functional layer is located laterally to a single position of the cavity without extending circumferentially around the cavity, so that the second entry is entirely located laterally to only a single side of the cavity.

* * * * *